United States Patent
Kenny et al.

(10) Patent No.: US 9,859,040 B2
(45) Date of Patent: Jan. 2, 2018

(54) METHOD FOR MAKING CABLE JACKET WITH EMBEDDED SHIELD

(71) Applicant: General Cable Technologies Corporation, Highland Heights, KY (US)

(72) Inventors: Robert D. Kenny, Cincinnati, OH (US); David M. Fausz, Fort Thomas, KY (US); David P. Camp, II, Florence, KY (US)

(73) Assignee: General Cable Technologies Corporation, Highland Heights, KY (US)

( * ) Notice: Subject to any disclaimer, the term of this patent is extended or adjusted under 35 U.S.C. 154(b) by 0 days.

(21) Appl. No.: 15/152,265

(22) Filed: May 11, 2016

(65) Prior Publication Data

US 2016/0254078 A1    Sep. 1, 2016

Related U.S. Application Data

(60) Continuation of application No. 13/948,828, filed on Jul. 23, 2013, now Pat. No. 9,362,027, which is a
(Continued)

(51) Int. Cl.
*H01B 7/00* (2006.01)
*H01B 13/24* (2006.01)
(Continued)

(52) U.S. Cl.
CPC .......... *H01B 13/24* (2013.01); *H01B 11/002* (2013.01); *H01B 11/1008* (2013.01);
(Continued)

(58) Field of Classification Search
CPC ............. H01B 11/002; H01B 11/1008; H01B 11/1856; H01B 13/24; H01B 13/18; H01B 13/141
(Continued)

(56) References Cited

U.S. PATENT DOCUMENTS

| 3,312,774 A | 4/1967 | Peterson |
| 4,449,774 A | 5/1984 | Takashi et al. |

(Continued)

FOREIGN PATENT DOCUMENTS

| CL | 200003218 | 11/2001 |
| CL | 200402786 | 4/2006 |

(Continued)

OTHER PUBLICATIONS

Kitajima, Kenji; Notification of Reason(s) for Refusal issued in related Japanese Patent Application No. 2014-514463; dated Nov. 17, 2015; 9 pages, including English translation.
(Continued)

*Primary Examiner* — William H Mayo, III
(74) *Attorney, Agent, or Firm* — Ulmer & Berne LLP

(57) ABSTRACT

A cable includes a jacket, a shielding tape, a pair of wires, an inner and outer jacket layer, and a separator. The shielding tape includes a substrate and a plurality of conductive shield segments disposed on the substrate. The pair of wires form a twisted pair. The inner and outer jacket layers are extruded onto inner and outer surfaces, respectively, of the substrate. The substrate, the inner jacket layer and the outer jacket layer are bonded together into a single layer that defines a circumference. Each of the conductive shield segments: extends only partially around the circumference of the single layer; is longitudinally spaced from each longitudinally adjacent one of the conductive shield segments; is radially spaced from, and overlaps a portion of, each immediately circumferentially adjacent one of the conductive shield segments; and is embedded in at least one of the inner jacket layer and the outer jacket layer.

13 Claims, 2 Drawing Sheets

Related U.S. Application Data division of application No. 13/157,492, filed on Jun. 10, 2011, now abandoned.

(51) Int. Cl.

| | | |
|---|---|---|
| *H01B 13/18* | (2006.01) |
| *H01B 11/18* | (2006.01) |
| *H01B 11/10* | (2006.01) |
| *H01B 13/14* | (2006.01) |
| *H01B 11/00* | (2006.01) |
| *H05K 9/00* | (2006.01) |
| *B29C 47/02* | (2006.01) |
| *B29C 47/06* | (2006.01) |
| *B29C 47/00* | (2006.01) |
| *B29L 31/34* | (2006.01) |

(52) U.S. Cl.
CPC ..... *H01B 11/1856* (2013.01); *H01B 11/1869* (2013.01); *H01B 13/141* (2013.01); *H01B 13/18* (2013.01); *H05K 9/0098* (2013.01); *B29C 47/0014* (2013.01); *B29C 47/0016* (2013.01); *B29C 47/025* (2013.01); *B29C 47/065* (2013.01); *B29K 2995/0005* (2013.01); *B29L 2031/3462* (2013.01)

(58) Field of Classification Search
USPC ...... 174/100 R, 113 R, 117 R, 117 F, 117 FF
See application file for complete search history.

(56) References Cited

U.S. PATENT DOCUMENTS

| | | | |
|---|---|---|---|
| 4,598,165 A | 7/1986 | Tsai |
| 4,701,575 A | 10/1987 | Gupta et al. |
| 5,180,890 A | 1/1993 | Pendergrass et al. |
| 5,552,565 A | 9/1996 | Cartier et al. |
| 6,297,454 B1 | 10/2001 | Gareis |
| 7,115,815 B2 | 10/2006 | Kenny et al. |
| 7,214,884 B2 | 5/2007 | Kenny et al. |
| 7,244,893 B2 | 7/2007 | Clark |
| 7,256,351 B2 | 8/2007 | Dillon et al. |
| 7,700,873 B2 | 4/2010 | Aumoitte |
| 8,217,267 B2 | 7/2012 | Nordin et al. |
| 8,445,787 B2 | 5/2013 | Nordin et al. |
| 2006/0048961 A1 | 3/2006 | Pfeiler et al. |
| 2006/0237220 A1 | 10/2006 | Leyendecker |
| 2006/0243477 A1 | 11/2006 | Jean et al. |
| 2007/0044996 A1 | 3/2007 | Clark |
| 2007/0193769 A1 | 8/2007 | Clark et al. |
| 2008/0041609 A1 | 2/2008 | Gareis et al. |
| 2009/0173511 A1 | 7/2009 | Smith et al. |
| 2009/0223694 A1 | 9/2009 | Nordin et al. |
| 2009/0294146 A1 | 12/2009 | Nordin et al. |
| 2010/0206608 A1 | 8/2010 | Nordin et al. |
| 2010/0219555 A1 | 9/2010 | Mehan |

FOREIGN PATENT DOCUMENTS

| | | |
|---|---|---|
| CL | 200402787 | 4/2006 |
| EP | 2439751 A2 | 4/2012 |
| JP | 2006-73534 A | 3/2006 |
| JP | 2008-506225 A | 2/2008 |
| WO | 2009143145 A1 | 11/2009 |

OTHER PUBLICATIONS

Kitajima, Kenji; Decision of Refusal issued in related Japanese Patent Application No. 2014-514463; dated Apr. 5, 2016; 7 pages, including English translation.

Kim, Tae Noon; International Search Report and Written Opinion of the International Searching Authority, issued in International Application No. PCT/US2012/067975; dated Apr. 1, 2013; 8 pages.

Hillmayr, Heinrich; Supplementary European Search Report, issued in European Patent Application No. 12797541.5; dated Sep. 24, 2014; 2 pages.

European Search Opinion, issued in European Patent Application No. 12797541.5; dated Dec. 2, 2014; 6 pages.

Duff, Hernan Gomez; Examiner's Report issued in related Chilean Patent Application No. 2013-003526; dated May 12, 2016; 10 pages, including translation.

Wong, Andy; Office Action issued in Canadian Patent Application No. 2,837,182; dated Feb. 17, 2017; 4 pages.

METHOD FOR MAKING CABLE JACKET WITH EMBEDDED SHIELD

CROSS REFERENCE TO RELATED APPLICATIONS

This application is a continuation application of U.S. patent application Ser. No. 13/948,828, filed Jul. 23, 2013, which is a divisional application of U.S. patent application Ser. No. 13/157,492, filed Jun. 10, 2011, the contents of each of which are incorporated herein by reference.

FIELD OF THE INVENTION

The present invention relates to a method for making a jacket for a cable that includes an embedded shield. More specifically, the jacket includes a shield that is a shielding tape with discontinuous conductive shielding segments. The shielding tape is embedded with the jacket by co-extruding the shielding tape with the jacket.

BACKGROUND OF THE INVENTION

Conventional communications cables typically include a core of twisted pairs of insulated conductors that are enclosed in a protective jacket. To avoid crosstalk with other cables, often referred to as alien crosstalk, conventional cables often include at least one shielding layer disposed around the core of twisted pairs of conductors. A non-conductive barrier layer between the shielding layer and the pairs must also be provided to insulate the core of pairs of the cable.

Such cables, however, are often bulky because of the requirement of both a shielding layer and a barrier layer. Therefore, a need exists for a cable that protects against alien crosstalk and that is not bulky.

SUMMARY OF THE INVENTION

Accordingly, the present invention may provide a method for making a cable jacket that comprises the steps of providing at least one shielding tape that has a substrate formed of a substrate material where the substrate includes at least one conductive segment; inserting the at least one shielding tape between first and second jacket layers of the cable jacket and each of the layers is formed of a jacket material; and co-extruding the shielding tape with the first and second jacket layers, wherein the substrate material of the shielding tape and the jacket material of the first and second jacket layers are the same such that during the co-extrusion step, the substrate and the first and second jacket layers bond together.

Other objects, advantages and salient features of the invention will become apparent from the following detailed description, which, taken in conjunction with the annexed drawings, discloses a preferred embodiment of the present invention.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Figure 1:
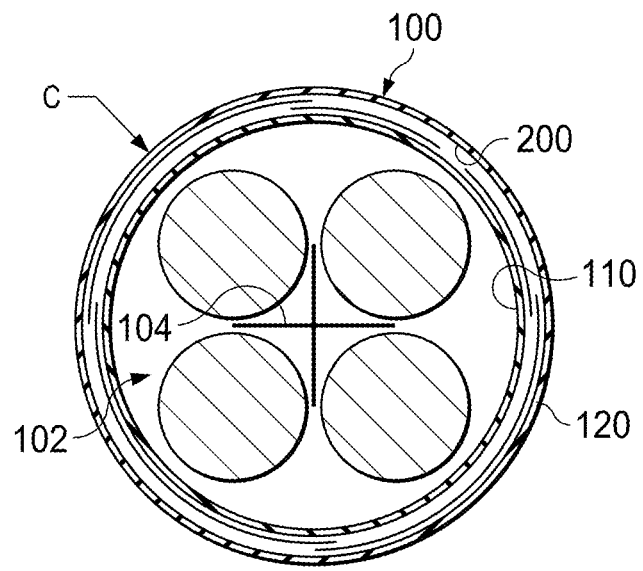
FIG. 1 is a cross-sectional view of a cable having a jacket according to an exemplary embodiment of the invention, showing the jacket with a plurality of shields embedded therein.
Figure 2:
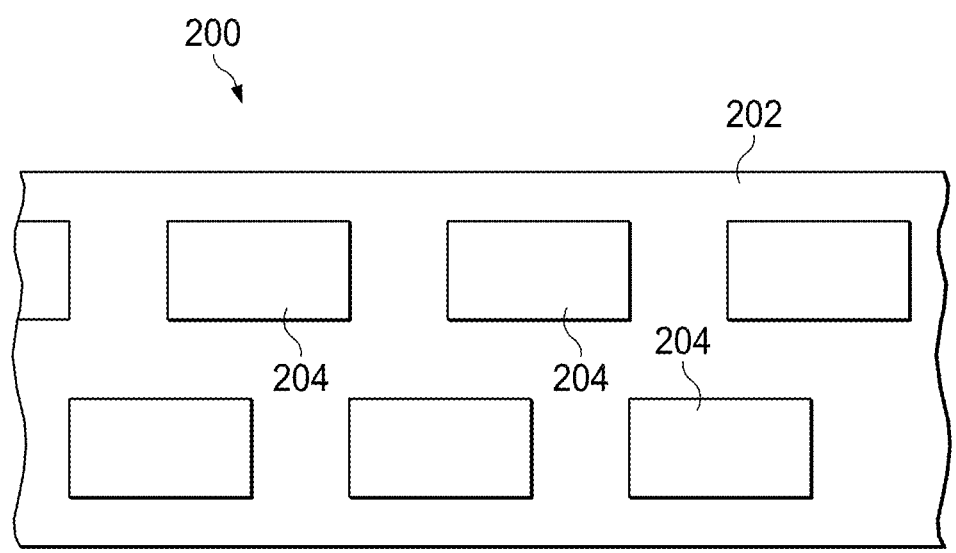
FIG. 2 is a plan view of a shield of the cable jacket illustrated in FIG. 1, showing the shield as a tape with a plurality of conductive segments.

Referring to FIGS. 1 and 2, a jacket 100 for a cable C, such as a communications cable, according to an exemplary embodiment of the present invention minimizes noise coming from external cable sources, i.e. alien crosstalk, without the need for grounding the cable C. The jacket 100 of the present invention accomplishes the above by combining at least one discontinuous shield 200 with the jacket material.

As seen in FIG. 1, the cable C includes the jacket 100, one or more twisted pairs of insulated conductors 102, and an optional separator 104 disposed between the pairs 102 to isolate the same. The jacket 100 includes inner and outer layers 110 and 120 that, when combined with one or more of the shields 200, form a single jacket. Preferably, the inner and outer layers 110 and 120 are extruded with the shields 200, such that the layers and shields melt together to form the jacket. Alternatively, the layers 110 and 120 and the shields 200 may be bonded to one another by any known method, such as adhesive and the like. The inner and outer layers 110 and 120 may be formed of any known jacket material for communication cabling, such as PVC, HDPE, FEP, flame retardant PE, or the like. Because the one or more shields 200 are incorporated in the jacket 100, a separate shielding layer surrounding the conductor pairs 102 is not required. Also, the inner layer 110 acts as a barrier between the one or more shields 200, thereby eliminating the need for a separate barrier layer. The overall diameter of the cable is reduced because less jacket material is required for the jacket 100 and both the shielding and barrier layers have been eliminated.

The shield 200 may be a shielding layer or tape made up of a substrate 202, as seen in FIG. 2, that is preferably of the same type and chemical nature of the material of the jacket 100. For example, if the material of the jacket 100 is PVC, then the substrate of the shielding tape is also PVC. That allows the jacketing material to properly bond with the substrate material of the shielding tape 200 to form the single jacket 100.

The shielding tape 200 may include a plurality of conductive segments 204, such as aluminum, copper, ferrite, or any other conductive bricks. The segments 204 may be applied to the surface of the substrate 202 by adhesive, heat pressing, laser ablation, vapor deposition, or by spraying conductive particles onto the substrate 202 to form the segments. Alternatively, the conductive segments 204 can be sandwiched between two layers of the substrate 200. The conductive segments 204 are preferably spaced from each other, thereby forming a discontinuous shield, as seen in FIG. 2. Although the conductive segments 204 are shown as having a substantially rectangular shape, the segments 204 may have other shapes, such as square, trapezoidal, diamond, and the like. Additionally, the segments 204 may all be substantially the same size or may have various sizes. The conductive segments 204 may also be placed in a random pattern along the substrate.

According to an exemplary method of the present invention, one or more of the shielding tapes 200 is inserted into the jacket 100 during the jacket extrusion process. Specifically, the shielding tape 200 is pulled through the actual die/crosshead or tooling for the jacket 100 in between the inner and outer layers 110 and 120 of the jacket. Thus, one or more shielding tapes 200 may be sandwiched by the inner and outer jacket layers 110 and 120. During that co-extrusion process, the material of the jacket layers 110 and 120 is in a molten or near molten state. When the shielding tape or tapes 200 come into contact with the molten jacket material, bonding/melting of the shielding tape or tapes occurs within the jacket material. Alternatively, the two jacket layers may be preformed materials (not in a molten state) that are bonded together.

Preferably, the material of the jacket 100 and its layers 110 and 120 are the same as the substrate 202 of the shielding tapes 200, so that the materials readily mix and bond to each other. This creates a near seamless dispersing of the shielding tape 200 within the jacket 100. Alternatively, the jacket layers 110 and 120 may be formed of a different material than the substrate 202 of the shielding tapes 200. In that case, the jacket layers 110 and 120 may be bonded to the substrates 202 of the shielding tapes by any know method, such as adhesive bonding, high pressure, or the like. On the other hand, the outer jacket layer 120 may suffice as a barrier to hold the shielding tape 200 and the inner jacket layer 110 in place.

During the co-extrusion process, the conductive segments 204 are encased in the jacket 100 while also maintaining the original orientation of the segments on the shielding tape 200. That orientation of the segments insures consistent electrical properties of the cable, such as return loss and attenuation. Thus, the method of the present invention allows conductive shielding segments 204 to be inserted into the jacket 100 without negatively impacting the physical properties of the jacket, such as tensile strength and elongation. That is because the near continuous material of jacket 100 (incorporated with one or more shielding tapes 200) maintains its original tensile strength as well as elongation properties.

Figure 3:
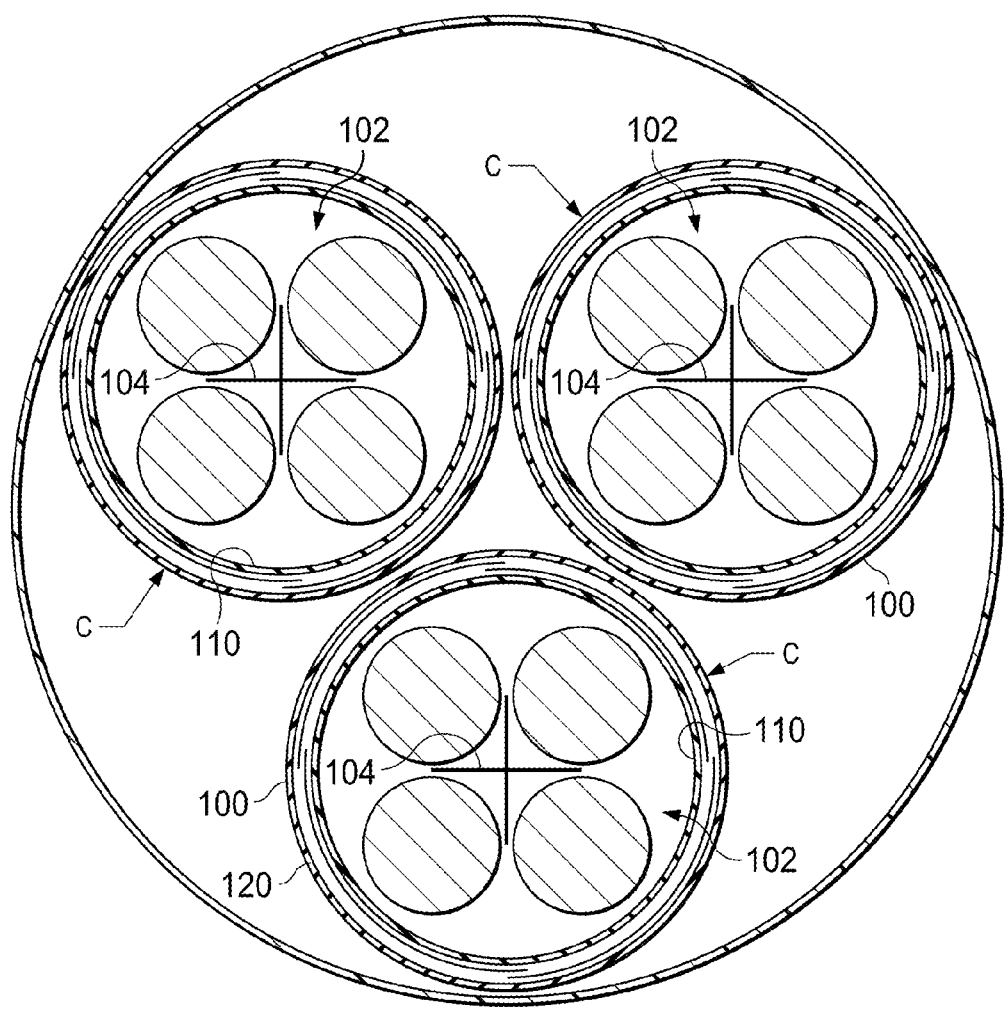
FIG. 3 is a cross-sectional view of a cable assembly according to an embodiment of the invention, showing a plurality of the cables bundled together.

Referring to FIG. 3, a plurality of the cables C may be bundled together. An optional outer jacket 300 may be provided that encloses the bundle cables C. Each cable C includes the jacket 100, as described above.

While particular embodiments have been chosen to illustrate the invention, it will be understood by those skilled in the art that various changes and modifications can be made therein without departing from the scope of the invention as defined in the appended claims.

What is claimed is:

1. A cable comprising:
a jacket having an annular shape at a cross-section taken orthogonal to a central axis of the jacket;
a shielding tape comprising a substrate and a plurality of conductive shield segments disposed on the substrate;
a pair of wires that form a twisted pair;
an inner jacket layer extruded onto an inner surface of the substrate and over the twisted pair;
a separator routed through an interior of the inner jacket layer; and
an outer jacket layer extruded onto an outer surface of the substrate; wherein:
the substrate, the inner jacket layer and the outer jacket layer are bonded together into a single layer that defines a circumference; and
each of the conductive shield segments:
extends only partially around the circumference of the single layer;
is longitudinally spaced from each longitudinally adjacent one of the conductive shield segments;
is radially spaced from, and overlaps a portion of, each immediately circumferentially adjacent one of the conductive shield segments; and
is embedded in at least one of the inner jacket layer and the outer jacket layer such that the at least one of the inner jacket layer and the outer jacket layer extends between the conductive shield segment and an adjacent one of the conductive shield segments.

2. The cable of claim 1, wherein the substrate, the inner jacket layer, and the outer jacket layer are formed of substantially the same material.

3. The cable of claim 2 wherein the substrate, the inner jacket layer, and the outer jacket layer are formed together in a one-piece construction.

4. The cable of claim 1 wherein the conductive shield segments comprise one or more of sprayed conductive shield segments, heat pressed conductive shield segments, and vapor deposited conductive shield segments.

5. The cable of claim 1 wherein each of the conductive shield segments is formed of one or more of aluminum, copper, and ferrite.

6. The cable of claim 1 wherein each of the conductive shield segments extends about one-fourth of the way around the circumference of the jacket.

7. A cable comprising:
a pair of wires that form a twisted pair;
a shielding tape comprising a substrate and a plurality of conductive shield segments disposed on the substrate;
a jacket defining a circumference, the jacket comprising an inner jacket layer and an outer jacket layer, the inner jacket layer being extruded onto an inner surface of the substrate and over the twisted pair and the outer jacket layer being extruded onto an outer surface of the substrate; and
a separator routed through an interior of the inner jacket layer; wherein:
the substrate, the inner jacket layer and the outer jacket layer are heat bonded together into a single layer; and
each of the conductive shield segments:
extends only partially around the circumference of the jacket;
is longitudinally spaced from each longitudinally adjacent one of the conductive shield segments;
is radially spaced from, and overlaps a portion of, each immediately circumferentially adjacent one of the conductive shield segments; and
is embedded in one of the inner jacket layer and the outer jacket layer such that one of the inner jacket layer and the outer jacket layer extends between the conductive shield segment and an adjacent one of the conductive shield segments.

8. The cable of claim 7 wherein the substrate, the inner jacket layer, and the outer jacket layer are formed of substantially the same material.

9. The cable of claim 8 wherein the substrate, the inner jacket layer, and the outer jacket layer are formed together in a one-piece construction.

10. The cable of claim 7 further comprising routing a separator through an interior of the jacket adjacent to the twisted pair.

11. The cable of claim 7 wherein each of the conductive shield segments is formed of one or more of aluminum, copper, and ferrite.

12. The cable of claim 7 wherein the conductive shield segments comprise one or more of sprayed conductive shield segments, heat pressed conductive shield segments, and vapor deposited conductive shield segments.

13. The cable of claim 7 wherein each of the conductive shield segments extends about one-fourth of the way around the circumference of the jacket.

\* \* \* \* \*